(12) United States Patent
Muhammad et al.

(10) Patent No.: US 8,060,027 B2
(45) Date of Patent: *Nov. 15, 2011

(54) RF TRANSMISSION LEAKAGE MITIGATOR, METHOD OF MITIGATING AN RF TRANSMISSION LEAKAGE AND CDMA TRANSCEIVER EMPLOYING THE SAME

(75) Inventors: Khurram Muhammad, Dallas, TX (US); Dirk Leipold, Oberschan (DE)

(73) Assignee: Texas Instruments Incorporated, Dallas, TX (US)

( * ) Notice: Subject to any disclaimer, the term of this patent is extended or adjusted under 35 U.S.C. 154(b) by 93 days.

This patent is subject to a terminal disclaimer.

(21) Appl. No.: 12/721,930

(22) Filed: Mar. 11, 2010

(65) Prior Publication Data
US 2010/0167655 A1  Jul. 1, 2010

Related U.S. Application Data

(62) Division of application No. 11/270,121, filed on Nov. 9, 2005, now Pat. No. 7,706,755.

(51) Int. Cl.
*H04B 1/38* (2006.01)

(52) U.S. Cl. ............. 455/73; 455/109; 455/78; 455/106

(58) Field of Classification Search .............. 455/73–88, 455/91–129
See application file for complete search history.

(56) References Cited

U.S. PATENT DOCUMENTS

| | | | |
|---|---|---|---|
| 7,072,614 B1 * | 7/2006 | Kasperkovitz | 455/24 |
| 7,792,501 B2 * | 9/2010 | Ahn | 455/114.1 |
| 7,822,393 B2 * | 10/2010 | Hirano et al. | 455/109 |
| 2007/0194886 A1 * | 8/2007 | Bang et al. | 455/78 |
| 2008/0242245 A1 * | 10/2008 | Aparin | 455/106 |

* cited by examiner

*Primary Examiner* — Lana N Le
(74) *Attorney, Agent, or Firm* — Lawrence J. Bassuk; W. James Brady; Frederick J. Telecky, Jr.

(57) ABSTRACT

The present invention provides an RF transmission leakage mitigator for use with a full-duplex, wireless transceiver. In one embodiment, the RF transmission leakage mitigator includes an inversion generator configured to provide an RF transmission inversion signal of an interfering transceiver RF transmission to a receiving portion of the transceiver thereby creating a residual leakage signal. Additionally, the RF transmission leakage mitigator also includes a residual processor coupled to the inversion generator and configured to adjust the RF transmission inversion signal of the interfering transceiver RF transmission based on reducing the residual leakage signal to a specified level.

8 Claims, 2 Drawing Sheets

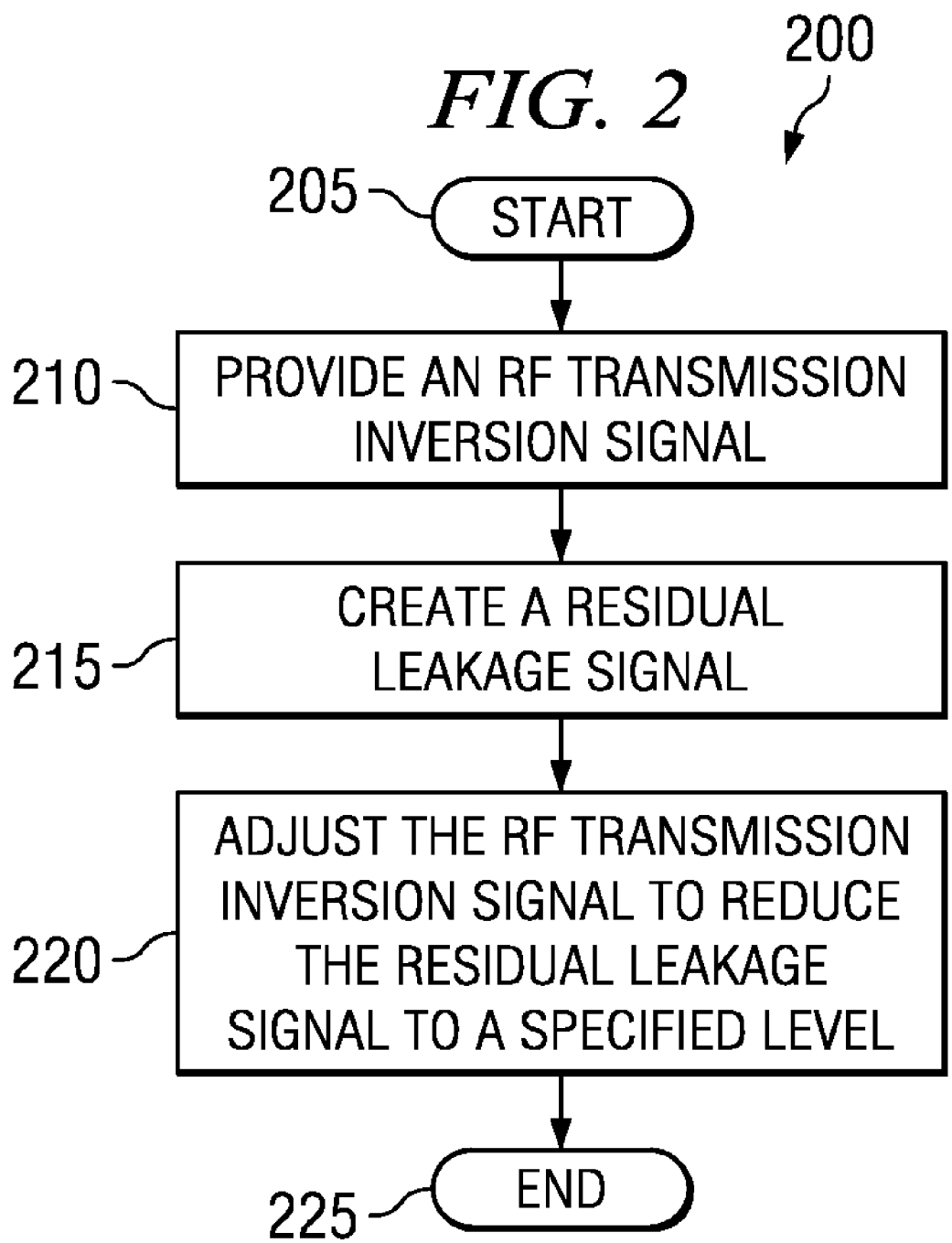

RF TRANSMISSION LEAKAGE MITIGATOR, METHOD OF MITIGATING AN RF TRANSMISSION LEAKAGE AND CDMA TRANSCEIVER EMPLOYING THE SAME

TECHNICAL FIELD OF THE DISCLOSURE

The present invention is directed, in general, to a communication system and, more specifically, to an RF transmission leakage mitigator, a method of RF transmission leakage mitigation and a CDMA transceiver employing the mitigator or the method.

BACKGROUND OF THE DISCLOSURE

CDMA based systems operate in a full-duplex mode. That is, they transmit and receive signals at the same time. The transmitter and receiver signal paths usually use a common antenna and are separated by a duplex filter, commonly called a duplexer. Unfortunately, duplexers do not provide perfect signal isolation between the transmitter and the receiver thereby allowing the receiver to experience transmitter signal leakage. This particular problem is exacerbated due to the fact that the size of CDMA transceivers, such as cell phones, and their components have been shrinking thereby tending to further lower the transmitter-receiver isolation attainable in the duplexer.

The receiver typically employs a low noise amplifier as a front end, which is connected through the duplexer to the common antenna. The low noise amplifier, to a large extent, establishes the noise figure of the receiver. The noise contribution of each block in the receiver chain is reduced by the total gain of the blocks preceding it. Therefore, for minimum receiver noise factor, the gain of the low noise amplifier is usually maximized and its noise factor is minimized based on other receiving block constraints. However, at maximum transmitter output power, the transmitter signal leakage can cause the low noise amplifier to saturate due to this large gain thereby imposing difficult constraints for the receiver design.

Accordingly, what is needed in the art is an enhanced way to accommodate transmitted energy interference in a receiver portion of a full duplex transceiver.

SUMMARY OF THE DISCLOSURE

To address the above-discussed deficiencies of the prior art, the present invention provides an RF transmission leakage mitigator for use with a full-duplex, wireless transceiver. In one embodiment, the RF transmission leakage mitigator includes an inversion generator configured to provide an RF transmission inversion signal of an interfering transceiver RF transmission to a receiving portion of the transceiver thereby creating a residual leakage signal. Additionally, the RF transmission leakage mitigator also includes a residual processor coupled to the inversion generator and configured to adjust the RF transmission inversion signal of the interfering transceiver RF transmission based on reducing the residual leakage signal to a specified level.

In another aspect, the present invention provides a method of mitigating an RF transmission leakage for use with a full-duplex, wireless transceiver. The method includes providing an RF transmission inversion signal of an interfering transceiver RF transmission to a receiving portion of the transceiver thereby creating a residual leakage signal. The method also includes adjusting the RF transmission inversion signal of the interfering transceiver RF transmission based on reducing the residual leakage signal to a specified level.

The present invention also provides, in yet another aspect, a full-duplex CDMA transceiver. The full-duplex CDMA transceiver employs a transmitter providing a transmission and a receiver coupled to the transmitter. The full-duplex CDMA transceiver includes an RF transmission leakage mitigator, coupled to the transmitter and the receiver, having an inversion generator that provides an RF transmission inversion signal of an interfering transceiver RF transmission to a receiving portion of the transceiver thereby creating a residual leakage signal. The RF transmission leakage mitigator also has a residual processor, coupled to the inversion generator, that adjusts the RF transmission inversion signal of the interfering transceiver RF transmission based on reducing the residual leakage signal to a specified level.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIG. 2 illustrates a flow diagram of an embodiment of a method of mitigating an RF transmission leakage carried out in accordance with the principles of the present invention.

DETAILED DESCRIPTION

Figure 1:
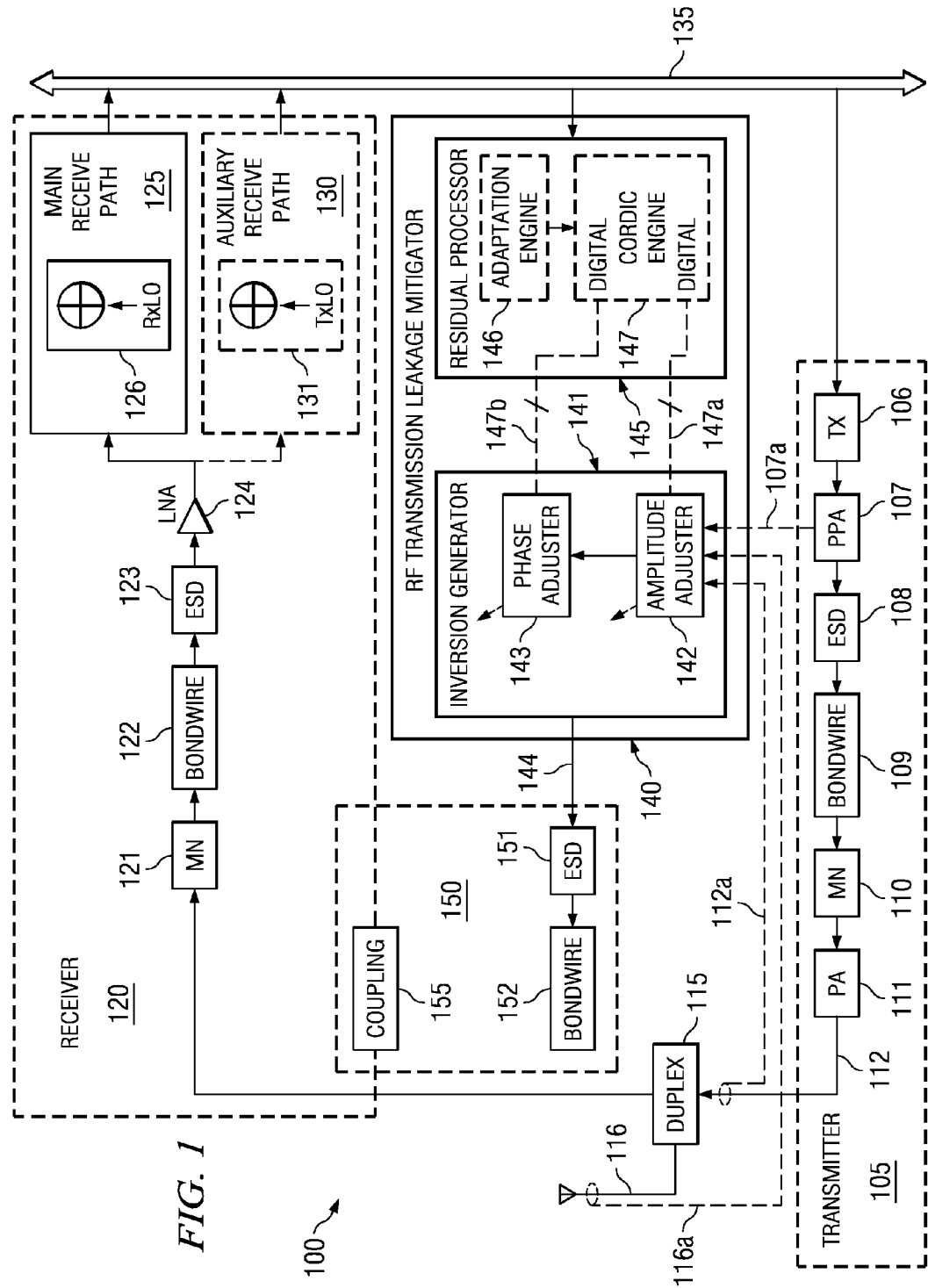
FIG. 1 illustrates a system diagram of an embodiment of a CDMA transceiver constructed in accordance with the principles of the present invention.

Referring initially to FIG. 1, illustrated is a system diagram of an embodiment of a CDMA transceiver, generally designated 100, constructed in accordance with the principles of the present invention. The CDMA transceiver 100 includes a transmitter 105, a duplexer 115 coupled to an antenna 116, a receiver 120, an open control platform (OCP) bus 135 and an RF transmission leakage mitigator 140 that employs an inversion signal coupling network 150.

The CDMA transceiver 100 is a full-duplex transceiver in that it may transmit and receive signals concurrently. When the transmitter 105 provides a transmission to the duplexer 115 for transmission by the antenna 116, an interfering transceiver RF transmission is also typically cross-coupled into the receiver 120. To reduce this interference, the RF transmission leakage mitigator 140 provides an RF transmission inversion signal 144 that mitigates its effect. This mitigation is provided at RF frequencies as opposed to mitigation at a lower frequency.

The transmitter 105 includes a transmit module 106 coupled to the OCP bus 135, a power preamplifier 107, a transmitter electrostatic discharge module 108, a transmit bondwire 109, a transmit matching network 110 and a power amplifier 111 coupled to the duplexer 115. The OCP bus 135 provides an interface to digital signal processing, which accommodates both transmission and reception processing in the digital domain for the CDMA transceiver 100.

The transmit module 106 prepares an RF transmit signal from the OCP bus 135 for transmission and provides it to the power preamplifier 107, which supplies a portion of the amplification needed to transmit the RF signal. The transmitter electrostatic discharge module 108 accommodates electrostatic discharge isolation for a portion of the transmitter 105 that is coupled off-chip by the transmit bondwire 109. The transmit matching network 110 provides a matched coupling of the RF transmit signal to the power amplifier 111 wherein additional power amplification is provided to the duplexer 115 for transmission by the antenna 116.

The duplexer 115 does not provide perfect isolation between the output of the transmitter 105 and the input of the receiver 120 and is typically a main source of the interfering transceiver RF transmission experienced by the receiver 120. Other interfering transceiver RF transmission areas may include spurious coupling from bondwires or a common substrate employed by the transmitter 105 and the receiver 120. Since transmission and reception may occur concurrently, even an attenuated transmission interference may prove significant, since an RF receive signal is typically much smaller than the RF transmit signal by one or perhaps several orders of magnitude.

In the illustrated embodiment, the receiver 120 includes a receive matching network 121 coupled between the duplexer 115 and a receive bondwire 122, a receiver electrostatic discharge module 123, a low noise amplifier 124 and a main receive path 125 that is coupled to the OCP bus 135. The main receive path 125 employs a main receive mixer 126, which uses a receive local oscillator RxLO. The receive matching network 121 provides a matched coupling for the RF receive signal through the receive bondwire 122 to the receiver electrostatic discharge module 123, thereby accommodating electrostatic discharge isolation for the low noise amplifier 124. The low noise amplifier 124 amplifies and conditions the RF receive signal and provides it to the main receive path 125 wherein it is down-converted by the main receive mixer 126 to a DC value. The down-converted receive signal is digitized and routed through the OCP bus 135 for further digital signal processing.

The inversion signal coupling network 150 couples the RF transmission inversion signal 144 from the RF transmission leakage mitigator 140 to the receiver 120. The inversion signal coupling network 150 includes a coupling electrostatic discharge module 151, an inversion signal bondwire 152 and an inversion signal coupling 155. The coupling electrostatic discharge module 151 provides electrostatic discharge isolation for the RF transmission leakage mitigator 140. The inversion signal bondwire 152 works in concert with the receive bondwire 122 through the inversion signal coupling 155 to allow mitigation of the interfering transceiver RF transmission that is coupled to the receiver 120. In the illustrated embodiment, the inversion signal coupling 155 provides the RF transmission inversion signal 144 to the receiver 120 employing a magnetic coupling.

The magnetic coupling may be provided by only employing appropriate proximate spacing of the inversion signal bondwire 152 and the receive bondwire 122. Magnetic materials, such as a magnetic core, may also be employed as appropriate to a particular application. Alternatively, the inversion signal coupling 155 may be an electrical coupling that employs passive, active or a combination of such components to couple the RF transmission inversion signal 144 to the receiver 120.

In an alternative embodiment, a coupling strip may be employed instead of one or both of the inversion signal bondwire 152 and the receive bondwire 122 to couple the RF transmission inversion signal 144 to the receiver 120. This arrangement may also employ magnetic or electrical coupling for the inversion signal coupling 155. Of course one skilled in the pertinent art will recognize that various combinations employing bondwires and coupling strips having electrical and magnetic coupling may be used as appropriate to a particular application.

An RF residual leakage signal is produced in the receiver 120 as a result of combining the interfering transceiver RF transmission and the RF transmission inversion signal 144. The RF residual leakage signal progresses through the low noise amplifier 124 and the main receive path 125 along with the RF receive signal and is down-converted by the main mixer 126 along with the receive signal. However, the RF residual leakage signal employs a frequency spacing of about 45 MHz from the receive signal since the CDMA transceiver 100 provides a 45 MHz spacing between transmit and receive signals, in the illustrated embodiment. Of course, other embodiments may employ a different transmit and receive frequency spacing and may also have multiple transmission and reception band capability, although only one of the bands is employed at a given time.

Additionally, an alternative embodiment of the receiver 120 may employ an auxiliary receive path 130 that has an auxiliary transmit mixer 131 using a transmit local oscillator TxLO. This path provides a dc value for the down-converted RF residual leakage signal, which may facilitate its processing in some applications. In either case, the down-converted RF residual leakage signal is digitized and routed through the OCP bus 135 for further digital signal processing to adjust the RF transmission inversion signal 144.

Phase noise is associated with timing jitter of an oscillator and may provide a significant addition to thermal noise. The presence of phase noise due to jitter in transmit and receive local oscillators tends to broaden the spectra associated with transmit and receive signals. This broadening may be represented by a general transfer function of 1/s, where s is the complex frequency variable associated with the Laplace transform. A judicious selection of the RF transmission inversion signal 144 by the RF transmission leakage mitigator 140 allows a substantial "neutralization" of the phase noise associated with the interfering transceiver RF transmission.

The RF transmission leakage mitigator 140 is coupled to both the transmitter 105 and the receiver 120 and includes an inversion generator 141, which employs an amplitude adjuster 142 and a phase adjuster 143. The inversion generator 141 provides the RF transmission inversion signal 144 to the receiver 120, which is a replica of the interfering transceiver RF transmission that has a phase difference of about 180 degrees with respect to it. This phase shifted replica allows formation of the residual leakage signal in the receiver 120.

The inversion generator 141 may employ at least one of several coupling schemes to the transmitter 105 to obtain an input transmit signal that may be used in generating the RF transmission inversion signal 144. The coupling schemes illustrated in the embodiment of FIG. 1 include a power preamplifier coupling 107*a*, a transmitter output coupling 112*a* from a transmitter output 112 or an antenna coupling 116*a* from the antenna 116. Typically, only one of these schemes is employed in a specific application.

In the illustrated embodiment, the amplitude adjuster 142 may be either a passive network or an active network. Similarly, the phase adjuster 143 may also be either a passive network or an active network. Of course, one of the phase adjuster 143 and the amplitude adjuster 142 may be a passive network while the other is an active network. Although passive networks are often more stable, selection of appropriate phase and amplitude networks may depend on other application specific parameters. The amplitude and phase adjusters 142, 143 are digitally controllable and may be composed of either T-network or Pi-network elements.

In the illustrated embodiment, the amplitude adjuster 142 may employ amplitude adjustments over a range of about 25 dB to 35 dB for each of either gain or attenuation functions employing steps in a range of about 0.5 dB to 1.0 dB per step. Analogously, the phase adjuster 143 may employ phase adjustments over a range of about −180 degrees to +180 degrees (360 degrees total) employing steps in a range of about 1.0 to 2.0 degrees per step.

The RF transmission leakage mitigator 140 also includes a residual processor 145. The residual processor 145 is coupled to the inversion generator 141 and adjusts the RF transmission inversion signal 144 based on reducing the residual leakage signal to a specified level, thereby decreasing the effect of the interfering transceiver RF transmission on the receiver 120. The specified level may be typically targeted to be below a thermal noise floor associated with the low noise amplifier 124 in the receiver 120, which effectively provides neutralization the effect of the interfering transceiver RF transmission. Of course, other specified levels may be employed as appropriate to a particular application.

In the illustrated embodiment, the residual processor 145 provides filtering in the digital domain and presents digital amplitude and phase adjustment signals 147a, 147b to both the amplitude adjuster 142 and the phase adjuster 143, respectively. Correspondingly, reducing the effect of the interfering transceiver RF transmission may be performed by zero-forcing the residual leakage signal to the specified level using a Least Mean Square (LMS) algorithm. In this example, a single complex coefficient is enough to track the input variations.

As discussed earlier, transmission leakage routinely occurs from energy at the transmitter output 112 leaking to the receiver input through the reverse isolation of the duplexer 115. Recall that a second path is intentionally formed by selecting an appropriate coupling point that feeds transmitter energy through the controllable amplitude and phase adjusters 142, 143 back to the input (or alternatively, the output may be used) of the low noise amplifier 124.

The summation of this conditioned transmission signal and the undesired leakage signal forms the residual leakage signal (an error signal) that may be down-converted by the auxiliary receive path 130 (driven by the transmit local oscillator TxLO) for direct conversion. This down-converted signal produces a complex error vector with I and Q branches that is furnished to an adaptation engine 146 via the OCP bus 135. The adaptation engine 146 uses the LMS algorithm to train an internal weight. This weight is converted from a Cartesian representation to a polar representation using a COordinated Rotation DIgital Calculation (CORDIC) engine 147, which provides the digital amplitude and phase adjustment signals 147a, 147b, noted above. In the present embodiment, it is sufficient to employ a complex scalar weight that is adapted periodically at a convenient rate for low-power and low-area implementation.

Many methods are available for this adaptation. For example, a steepest descent approach may be employed as represented by equation (1) below.

$$w(n+1) = w(n) - u\, \text{Delta}(n), \qquad (1)$$

where w represents a complex weight and n refers to a time index. The quantity u is a scalar quantity used to control the rate of adaptation in the LMS algorithm and is normally referred to as a step size. Delta(n) represents the slope of an error (i.e., residual leakage) squared signal.

When using the LMS algorithm, true averages are replaced by instantaneous values. Hence, Delta(n) may be approximated by e(n)[e(n)−e(n−1)] (normally Delta(n) represents the slope of the mean-squared error). Signed-data or a signed-signed LMS approach may also be used. Of course, one skilled in the pertinent art will recognize that there are several other ways to formulate the above optimization problem that attempts to train a weight such that e(n) is forced to zero on the average. In addition to zero-forcing, Newton search, quasi-Newton, Conjugate direction and least squares may be adapted to solve the above problem.

Turning now to FIG. 2, illustrated is a flow diagram of an embodiment of a method of mitigating an RF transmission leakage, generally designated 200, carried out in accordance with the principles of the present invention. The method 200 is for use with a full-duplex wireless transceiver and starts in a step 205. Then, in a step 210, an RF transmission inversion signal is provided that is a replica of an interfering transceiver RF transmission that has been phase shifted by about 180 degrees. An interfering signal generated by the interfering transceiver RF transmission may itself be phase shifted thereby requiring a phase adjustment of the replica around a phase shift of 180 degrees.

The RF transmission inversion signal is applied to a receiving portion of the wireless transceiver thereby creating a residual leakage signal, in a step 215. The RF transmission inversion signal may be provided to the receiving portion of the wireless transceiver employing a bond wire or a coupling strip. Additionally, the RF transmission inversion signal may be provided to the receiving portion of the transceiver employing an electrical coupling or a magnetic coupling.

Then, in a step 220, the RF transmission inversion signal of the interfering transceiver RF transmission is adjusted based on reducing the residual leakage signal to a specified level. The adjustment of the RF transmission inversion signal in the step 220 employs at least one of a phase adjustment or an amplitude adjustment. Additionally, a passive network or an active network provides the phase adjustment, and a passive network or an active network also provides the amplitude adjustment.

A down-converted representation of the residual leakage signal is employed to adjust the RF transmission inversion signal. The down-converted residual leakage signal may be provided by a main receive path employing a receive local oscillator or an auxiliary receive path employing a transmit local oscillator. A digital representation of the residual leakage signal is employed to adjust the RF transmission inversion signal, and a least mean square estimation may be employed to reduce the residual leakage signal to the specified level. In one embodiment, the specified level is a noise floor associated with the receiving portion, and in another embodiment, the specified level is appropriately selected based on its impact to the performance of a particular application. The method 200 ends in a step 225.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing an RF transmission leakage mitigator, a method of mitigating an RF transmission leakage and a CDMA transceiver employing the mitigator or the method have been presented. Advantages include a reduction of the effects of transmission energy leakage associated with full-duplex operation of a wireless transceiver. In one embodiment, the transmission interference is reduced at an input of a low noise amplifier associated with a receive signal path thereby avoiding an overload condition of the amplifier.

The embodiments employ a replica of an interfering transmission waveform that is substantially 180 degrees out of phase with the transmitter portion of the transceiver. This replica transmission is coupled to the input of the low noise amplifier through one of many possible methods, such as coupling through the bond wiring or placing a coupling strip close to the low noise amplifier input. The residual leakage signal is a difference signal that is processed through the low noise amplifier and is smaller than would otherwise be present. This residual energy is then down-converted and analyzed in the digital domain. An analysis algorithm provides a signal that directs the residual leakage energy toward zero until it is below the noise floor of the low noise amplifier, in one embodiment.

One signal processing embodiment employs a least mean square filtering algorithm that takes the residual leakage signal as an error signal and updates the filter coefficients such that the residual leakage energy is reduced to the specified level using mean square estimation. This solution provides an adaptive approach that often employs existing receiver and digital components to accommodate current and future transmission leakage situations.

Although the present invention has been described in detail, those skilled in the art should understand that they can make various changes, substitutions and alterations herein without departing from the spirit and scope of the invention in its broadest form.

What is claimed is:

1. A method of mitigating an RF transmission leakage for use with a full-duplex, wireless transceiver having a transmitter and a receiver, comprising:
   A. sending an RF transmission inversion signal to the receiver to reduce interference from an RF transmission from the transmitter into the receiver from a transmit signal, an amplitude adjustment signal, and a phase adjustment signal; and
   B. supplying the amplitude adjustment signal and the phase adjustment signal from a digital, down-converted RF residual leakage signal from the receiver in which the supplying includes employing a down-converted representation of the residual leakage signal to adjust the RF transmission inversion signal.

2. The method as recited in claim 1 in which the sending includes employing RF transmission inversion signal with a phase difference of about 180 degrees with respect to said interfering transceiver RF transmission.

3. The method as recited in claim 1 in which the sending includes sending the RF transmission inversion signal to the receiver employing a bond wire or a coupling strip.

4. The method as recited in claim 1 in which the sending includes sending the RF transmission inversion signal to the receiver employing an electrical coupling or a magnetic coupling.

5. The method as recited in claim 1 in which the supplying includes employing at least one of a phase adjustment and an amplitude adjustment.

6. The method as recited in claim 5 in which the phase adjustment is provided by a passive network or an active network.

7. The method as recited in claim 5 in which the amplitude adjustment is provided by a passive network or an active network.

8. The method as recited in claim 1 in which the employing a down-converted representation includes providing a path selected from one of a main receive path employing a receive local oscillator and an auxiliary receive path employing a transmit local oscillator.

* * * * *